US006794096B2

(12) United States Patent
Kroyan

(10) Patent No.: US 6,794,096 B2
(45) Date of Patent: Sep. 21, 2004

(54) PHASE SHIFTING MASK TOPOGRAPHY EFFECT CORRECTION BASED ON NEAR-FIELD IMAGE PROPERTIES

(75) Inventor: Armen Kroyan, San Francisco, CA (US)

(73) Assignee: Numerical Technologies, Inc., Mountain View, CA (US)

(*) Notice: Subject to any disclaimer, the term of this patent is extended or adjusted under 35 U.S.C. 154(b) by 168 days.

(21) Appl. No.: 10/268,874

(22) Filed: Oct. 9, 2002

(65) Prior Publication Data

US 2004/0073884 A1 Apr. 15, 2004

(51) Int. Cl.[7] ............................. G03F 9/00; G06F 17/50
(52) U.S. Cl. ............................................. 430/5; 716/19
(58) Field of Search .............................. 430/5; 716/19, 716/21

(56) References Cited

U.S. PATENT DOCUMENTS

| | | | |
|---|---|---|---|
| 5,631,110 A | 5/1997 | Shioiri et al. ................... | 430/5 |
| 5,682,323 A | 10/1997 | Pasch et al. ................. | 364/491 |
| 5,723,233 A | 3/1998 | Garza et al. .................... | 430/5 |
| 5,815,685 A | 9/1998 | Kamon ........................ | 395/500 |
| 5,825,647 A | 10/1998 | Tsudaka ................ | 364/167.03 |
| 5,991,006 A | 11/1999 | Tsudaka ....................... | 355/53 |
| 6,014,456 A | 1/2000 | Tsudaka ..................... | 382/144 |
| 6,081,658 A | 6/2000 | Rieger et al. .......... | 395/500.22 |
| 6,154,563 A | 11/2000 | Tsudaka .................... | 382/144 |
| 6,243,855 B1 | 6/2001 | Kobayashi et al. ........... | 716/19 |
| 6,249,597 B1 | 6/2001 | Tsudaka ..................... | 382/144 |
| 6,289,499 B1 | 9/2001 | Rieger et al. ................. | 716/21 |
| 6,298,473 B1 | 10/2001 | Ono et al. .................... | 716/21 |
| 6,453,457 B1 | 9/2002 | Pierrat et al. ................. | 716/19 |
| 6,670,082 B2 * | 12/2003 | Liu et al. ....................... | 430/5 |
| 6,681,379 B2 * | 1/2004 | Pierrat et al. ................. | 716/19 |
| 2002/0100004 A1 | 7/2002 | Pierrat et al. .................. | 716/5 |

FOREIGN PATENT DOCUMENTS

| | | |
|---|---|---|
| GB | 2324169 A | 10/1998 |
| JP | 3-80525 | 4/1991 |
| WO | WO 00/67074 A1 | 11/2000 |

OTHER PUBLICATIONS

Ackmann, P., et al., "Phase Shifting and Optical Proximity Corrections to Improve CD Control on Logic Devices in Manufacturing for Sub 0.35 um I–Line", SPIE, vol. 3051, pp. 146–153, Mar. 12–14, 1997.

Lithas, "Lithas: Optical Proximity Corrections Software" (2 pages).

Precim, "Proxima System". Precim Company, Portland, Oregon (2 pages).

Precim, "Proxima Wafer Proximity Corrections System", Precim Company, Portland, Oregon (2 pages).

Rieger, M., et al., "Mask Fabrication Rules for Proximity-Corrected Patterns", Precim Company, Portland, Oregon (10 pages).

(List continued on next page.)

*Primary Examiner*—S. Rosasco
(74) *Attorney, Agent, or Firm*—Bever, Hoffman & Harms, LLP; Jeanette S. Harms

(57) ABSTRACT

Image intensity imbalance created by a phase shifting mask (PSM) layout can be corrected using a near-field image. Because an aerial image is not used, various parameters associated with the exposure conditions and stepper need not be considered, thereby significantly simplifying the computations to determine the appropriate correction. Of importance, using the near-field image can provide substantially the same correction generated using the aerial image. Thus, using the near-field image can provide an accurate and quick correction for image intensity imbalance between shifters of different phases. After correcting for the image intensity imbalance, additional proximity correction techniques can be applied to the layout to correct for other effects.

20 Claims, 10 Drawing Sheets

OTHER PUBLICATIONS

Rieger, M., et al., "Using Behavior Modeling for Proximity Corrections", Precim Company, Portland, Oregon (6 pages).

Cobb, et al., "Fast Sparse Aerial Image Calculation for OPC", SPIE, vol. 2621, pp. 534–544, Sep. 20–22, 1995.

Lucas, K., et al., "Model Based OPC for 1st Generation 193nm Lithography", Motorola Inc., IDT assignee to IMEC (12 pages).

Stirniman, J., et al., "Quantifying Proximity and Related Effects in Advanced Wafer Processes", Precim Company, Hewlett Packard Labs (9 pages).

Sugawara, M., et al., "Practical Evaluations of Optical Proximity Effect Corrections by EDM Methodology", Sony Corporation (11 pages).

Saleh, B., et al., "Reductions of Errors of Microphotographic Reproductions by Optimal Corrections of Original Masks", Optical Engineering, vol. 20, No. 5, pp. 781–784, Sep./Oct. 1981.

Fu, C.C., et al., "Enhancement of Lithographic Patterns by Using Serif Features", IEEE, Transactions On Electron Devices, vol. 38, No. 12, pp. 2599–2603, Dec. 1991.

Harafuji, K., et al., "A Novel Hierarchical Approach for Proximity Effect Correction in Electron Beam Lithography", IEEE, vol. 12, No. 10, pp. 1508–1514, Oct. 1993.

Rieger, M., et al., "System for Lithography Proximity Compensations", Precim Company, Portland, Oregon, Sep. 1993 (28 pages).

Stirniman, J., et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE, Photomask Technology And Management, vol. 2333, pp. 239–246 (1994).

Stirniman, J., et al., "Wafer Proximity Correction and Its Impact on Mask–Making", Bacus News, vol. 10, Issue 1, pp. 1, 3–7, Jan. 10–12, 1994.

Henderson, R., et al., "Optical Proximity Effect Correction: An Emerging Technology", Microlithography World, pp. 6–12 (1994).

Barouch, E., et al., "OPTIMASK: An OPC Algorithm for Chrome and Phase–Shift Mask Design", SPIE, Vo. 2440, pp. 192–206, Feb. 1995.

Cobb, N., et al., "Fast Low–Complexity Mask Design", SPIE, vol. 2440, pp. 313–327, Feb. 22–24, 1995.

Yen, A., et al., "Characterization and Correction of Optical Proximity Effects in Deep–Ultraviolet Lithography Using Behavior Modeling", J. Vac. Sci. Technol. B, vol. 14, No. 6, pp. 4175–4178, Nov./Dec. 1996.

Morimoto, H., et al., "Next Generation Mask Strategy—Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Dolainsky, C., et al., "Applications of a Simple Resist Model to Fast Optical Proximity Correction", SPIE, vol. 3051, pp. 774–780 (1997).

Chuang, H., et al., "Practical Applications of 2–D Optical Proximity Corrections for Enhanced Performance of 0.25um Random Logic Devices", IEEE, pp. 18.7.1–18.7.4, Dec. 1997.

Cobb, N., et al., "Experimental Results on Optical Proximity Correction With Variable Threshold Resist Model", SPIE, vol. 3051, pp. 458–468, Mar. 12–14, 1997.

Asai, N., et al., "Proposal for the Coma Aberration Dependent Overlay Error Compensation Technology", Jpn. J. Appl. Phys., vol. 37, pp. 6718–6722 (1998).

Cobb, N., "Fast Optical and Process Proximity Correction Algorithms for Integrated Circuit Manufacturing", Dissertation, University of California at Berkeley, UMI Microform 9902038 (139 pages).

Toublan, O., et al., "Phase Aware Proximity Correction for Advanced Masks", SPIE, vol. 4000, pp. 160–170, Mar. 1–3, 2000.

Anonymous, "Modifying Traditional Model Optical Proximity Correction (MOPC) Flow To Include Mask Writer Issues", IPCOM000009586D, Sep. 4, 2002 (1 page).

Anonymous, "Parameterization For Full Shape And Rule Dependent Dissection", IPCOM000009587D, Sep. 4, 2002 (9 pages).

* cited by examiner

PHASE SHIFTING MASK TOPOGRAPHY EFFECT CORRECTION BASED ON NEAR-FIELD IMAGE PROPERTIES

BACKGROUND OF THE INVENTION

1. Field of the Invention

The invention relates to a phase shifting mask (PSM), and particularly to a method of correcting for image intensity imbalance on the PSM using near-field images.

2. Description of the Related Art

Photolithography is a well-known process used in the semiconductor industry to form lines, contacts, and other known structures in integrated circuits (ICs). In conventional photolithography, a mask (or a reticle) having a pattern of transparent and opaque regions representing such structures in one IC layer is illuminated. The emanating light from the mask is then focused on a photoresist layer provided on a wafer. During a subsequent development process, portions of the photoresist layer are removed, wherein the portions are defined by the pattern. In this manner, the pattern of the mask is transferred to or printed on the photoresist layer.

However, diffraction effects at the transition of the transparent regions to the opaque regions can render these edges indistinct, thereby adversely affecting the resolution of the photolithography process. Various techniques have been proposed to improve the resolution.

One advance in lithography called phase shifting is able to generate features on the wafer that are smaller than the corresponding wavelength of the light. These ultra-small features are generated by the interference of light in adjacent, complementary pairs of phase shifters having opposite phase, e.g. 0 and 180 degrees. In one embodiment, the phase shifters can be formed on a phase shifting mask (PSM), which is used in conjunction with a trim mask including protective regions to protect the features defined by the phase shifters and to define remaining structures.

In the PSM, complementary phase shifters (hereinafter referred to as shifters) are configured such that the exposure radiation transmitted by one shifter is 180 degrees out of phase with the exposure radiation transmitted by the other shifter. Therefore, rather than constructively interfering and merging into a single image, the projected images destructively interfere where their edges overlap, thereby creating a clear and very small image between the phase shifters.

Unfortunately, the transmission of light through the complementary shifters (for ease of reference, called 0- and 180-degree shifters) can be non-uniform. FIG. 1A illustrates a cross-section of a simplified PSM 100 including a 0-degree shifter 102 and a 180-degree shifter 103. Note that 0-degree shifter 102 is formed by etching through an opaque layer 104 of PSM 100 to expose substrate (e.g. quartz) 101. In contrast, 180-degree shifter 103 is formed by etching through an opaque layer 104 and then etching into substrate 101 to a predetermined depth.

This PSM topography effect produces an aerial image imbalance. Specifically, FIG. 1B illustrates a graph 105 comparing a first waveform (dashed line) 106 generated by using a theoretical thin mask (i.e. Kirchoff's) model and a second waveform (solid line) 109 generated by using a simulated EMF model. The peaks of high image intensity, e.g. peaks 107 and 108 of waveform 106 and peaks 110 and 111 of waveform 109, correspond to shifters 102 and 103 of PSM 100 (FIG. 1A). Of interest, peaks 107 and 108 have equal image intensity. However, peaks 110 and 111, which are generated with rigorous computations, have significantly different intensities. In particular, peak 110 (which represents 0-degree shifter 102) has a significantly higher image intensity than peak 111 (which represents 180-degree shifter 103).

An image intensity imbalance can cause a shift in feature location. For example, if an image intensity imbalance results from exposing PSM 100 (FIG. 1A), then the feature produced by that exposure might not be positioned in the middle of shifters 102 and 103, but might instead be closer to 180-degree shifter 103. Additionally, the image intensity imbalance can also result in variations in feature size. This displacement and size variation can contribute to an undesirable feature placement and size (or critical dimension (CD)) error on the wafer.

In some cases, the image intensity imbalance caused by 0- and 180-degree shifters can be corrected through the application of a predetermined amount of undercut in the substrate as shown in FIG. 2A. Specifically, instead of an anisotropic etch that generates a vertical trench in substrate 204, indicated by dashed lines 201, an isotropic etch can be used to generate a sloped trench 202 that undercuts opaque layer 203. More generally, any suitable etch process can be used. However, as feature sizes shrink below 100 nm, allowable undercut size becomes limited by mask making capabilities and therefore is no longer sufficient to correct the imbalance on its own.

Therefore, in such cases, the undercut methodology can be combined with space biasing as shown in FIG. 2B. Specifically, an opening 210 forming the 0-degree shifter can be biased inward, as indicated by arrows 211, whereas an opening 212 forming the 180-degree shifter can be biased outward, as indicated by arrows 213. Because the size of the 0-degree shifter decreases by an amount the size of the 180-degree shifter increases, the printed feature size should remain constant, which is desirable. Note that space biasing can be performed in some embodiments without undercutting.

FIG. 3 illustrates a flow chart 300 in which shifter biasing can be incorporated into tape out (and/or mask manufacture). After a layout is received in step 301, phase shifters can be assigned to various features in the layout in step 302. In one embodiment shown in step 303, these shifters can be separated to different layers based on their width. For example, shifters having a first predetermined width used for forming transistor gates can be separated from shifters having a second predetermined width used for forming interconnect lines. In one embodiment, a design-rule-checking (DRC) tool can perform this separation. A first proximity correction, e.g. rule-based optical proximity correction (OPC), can be applied in step 306 using the shifter information provided in step 303. Note that the term "optical proximity correction" is used generically herein to refer to proximity-correction generally, e.g. resist, etch, microloading, etc., except where from the context it is clear that optical proximity effects in particular are being exclusively considered.

Rule-based OPC can include rules to implement certain changes to the layout, thereby compensating for some lithographic distortions. Specifically, these changes can form features on the wafer that are closer to the original intended layout. With respect to shifters, rule-based OPC can provide the appropriate biasing to the shifters to minimize image intensity imbalance. Note that an undercut is performed during actual manufacture of the mask and therefore does not affect the layout as does space biasing. Space biasing is generally discussed in terms of N nm, wherein the initial width of the 0-degree shifter is decreased by N nm and the initial width of the 180-degree shifter (which is the same as the width of the 0-degree shifter) is increased by N nm. Note that slightly different biases can be applied to shifters in the shifter pair, although this can increase the complexity of computation. In one embodiment, the first proximity correction can provide a single bias and the second proximity correction can provide some refinement of that bias for each shifter in the shifter pair. For simplicity, one bias being applied to both shifters in the shifter pair is described in reference to the embodiments herein.

To provide the appropriate bias information to the first proximity correction tool, methodologies using an aerial image have been developed. These methodologies generally either emulate or simulate the aerial image produced by a stepper system. FIG. 4 illustrates a simplified stepper system in which an illumination 401 passes through a mask 402, thereby producing a near-field image 403. This near-field image 403 is then collected and focused by a complex system of lenses (shown for simplicity as a single lens 404) to generate an aerial image 405. Aerial image 405 corresponds to the image intensity on the wafer plane.

In one embodiment, an aerial image microscope system (AIMS) can be used to provide an emulated aerial image. Specifically, in AIMS, a physical mask is imaged under conditions that emulate a stepper. Thus, conditions associated with illumination 401, such as wavelength (X), partial coherence (a), and exposure dose, as well as properties of lens 404, such as numerical aperture (NA) and aberrations, can be used or approximated in imaging the physical mask. A high-resolution image capture device, such as a charge-coupled device (CCD) camera, can capture a gray-scale image at a theoretical wafer plane. Based on the captured image, various plots, e.g. image intensity plots, of the aerial image can then be calculated. Note that imaging with AIMS is generally first performed on a test mask, thereby allowing various biases to be analyzed before a production mask is made for a specific stepper operating under certain conditions.

In another embodiment, simulation can be used to provide the aerial image. This simulation must account for the conditions and properties associated with the stepper as well as parameters regarding the PSM. These parameters can include, for example, the size of the shifters, the pitch, and the line width of the chrome to be used for the mask. To ensure accuracy, this simulation requires rigorous calculations of electromagnetic field (EMF) scattering in the mask (e.g. calculations based on Maxwell equation solvers, such as the finite-difference-time-domain (FDTD) method). Note that although near-field image 403 is computed, this computation merely serves to simulate aerial image 405, which is the plane of interest (i.e. where the feature generated by the PSM will print on the wafer).

Referring back to FIG. 3, using either an emulated or simulated aerial image, various image intensity imbalances can be identified in step 304. One method of measuring an image intensity imbalance includes determining the maximum intensity at peaks 110 and 111 (FIG. 1B). Another method of measuring an image intensity imbalance includes determining the critical dimensions (CDs) of the shifters. These CDs, such as CDs 120 and 121 of waveform 109, are typically taken at a predetermined mid-range image intensity. The goal of using either the emulated or simulated aerial image is to determine when the image intensity imbalance is zero, i.e. the difference in peak intensities/CDs is zero. When the image intensity imbalance is zero, the 0-degree and 180-degree shifters provide equal transmission, thereby optimizing placement of the associated printed feature on the wafer.

After obtaining the image intensity imbalances using the aerial image, a bias table can be created in step 305. In one embodiment, this bias table can be stored in a library. The bias table can indicate the appropriate bias for particular pairs of shifters, mask properties, stepper properties, and illumination conditions. The OPC tool can access this bias table during rule-based OPC (step 306).

At this point, a second proximity correction, e.g. model-based OPC, can be performed in step 308. In model-based OPC, a real pattern transfer can be simulated (i.e. predicted) with a set of mathematical formulas (i.e. two-dimensional models provided in step 307). In model-based OPC, the edges of each shifter can be dissected into a plurality of segments, thereby allowing these segments to be individually moved to correct for proximity effects. The placement of the dissection points is determined by the shifter shape, size, and/or position relative to other features. After applying the first and second proximity corrections (in any order) to the PSM layout, the phase shifting mask is ready for manufacture in step 309.

One of the main challenges in mask manufacture is the effective use of system resources. Unfortunately, emulating the aerial image using AIMS requires a physical mask, which can take valuable time to make. Moreover, the image capture and emulation components in AIMS are complex, expensive components. Thus, using AIMS adds considerable time and expense to mask manufacturing. Simulation of the aerial image can also expend limited system resources. Specifically, because of the complexity of computation being performed (i.e. the mask topographies as well as the multitude of stepper parameters to consider), simulation of the aerial image can be extremely time consuming and resource intensive. Therefore, a need arises for a method of correcting for image intensity imbalance in a cost effective manner.

SUMMARY OF THE INVENTION

In accordance with one feature of the invention an image intensity imbalance for a phase shifting mask (PSM) layout can be corrected using a near-field image. Because an aerial image is not used, various exposure conditions and parameters associated with the stepper need not be considered, thereby significantly simplifying the computations to determine the appropriate correction. Of importance, using the near-field image can provide substantially the same correction generated using the aerial image. Thus, using the near-field image can provide a sufficiently accurate and quicker correction for image intensity imbalance as compared to fully simulating the aerial image.

In one embodiment, the correction for image intensity imbalance includes determining a bias for each shifter in a pair of phase shifters in the PSM layout. The bias can refer to N nm, wherein the initial width of a 0-degree shifter in the pair is decreased by N nm and the initial width of a 180-degree shifter (which is the same as the width of the 0-degree shifter) in the pair is increased by N nm.

Determining the bias can include integrating areas under a waveform, wherein the waveform represents the near-field image associated with the PSM. Specifically, a first area corresponding to a transmission of a first phase shifter in the pair of phase shifters can be integrated. Additionally, a second area corresponding to a transmission of a second phase shifter in the pair of phase shifters can also be integrated. Note that the exposure radiation transmitted by the first phase shifter is approximately 180 degrees out of phase with exposure radiation transmitted by the second phase shifter. After the integration of the first and second areas, a difference between the second area and the first area can be computed. This difference can be divided by the first area, thereby generating a normalized result. This normalized result (called an integrated intensity ratio or IIR) can be used to determine the appropriate bias, i.e. the bias that substantially corrects the image intensity imbalance for that size of shifters.

Determining the bias includes simulating near-field image results and computing the IIR for the given mask properties (e.g. undercut, etch, etc.) and layout properties (e.g. phase shifter width and length, line width of the chrome patterns, and/or pitch). Advantageously, determining the bias does not include simulating the optical and exposure settings of an imaging system usable with the PSM. Because these parameters need not be considered, the complexity of the simulations to compute the image intensity imbalance solution can be significantly reduced. Of importance, using information from the near-field image can provide substantially the same correction generated using information from the aerial image. Thus, using the near-field image can provide a sufficiently accurate and quicker correction for image intensity imbalance as compared to fully simulating the aerial image.

In accordance with another feature of the invention, a phase shifting mask (PSM) layout file is provided. The PSM layout file can include a plurality of shifter sizes. The exposure radiation transmitted by a first shifter in a pair of shifters is approximately 180 degrees out of phase with exposure radiation transmitted by a second shifter in the pair. For each shifter size, an appropriate bias for correcting an image intensity imbalance in the pair of shifters is given.

Advantageously, the appropriate bias is computed using the near-field image. Such computation can take into account specific mask structure and layout properties, but not settings of an imaging system. The specific mask structure and layout properties can include shifter dimensions, undercut, the line width of the chrome patterns, and/or the pitch (i.e. a parameter indicating whether the lines are densely spaced, moderately spaced, or isolated).

In accordance with yet another feature of the invention, a method of generating a PSM having minimal image intensity imbalance is provided. The method can include receiving a layout and applying phase shifting to the layout, thereby generating a PSM layout. In one embodiment, the shifters of the PSM layout can be separated to different layers based on shifter width. A first proximity correction, e.g. rule-based optical proximity correction (OPC), can be applied to the PSM layout based on a bias table. Of importance, the bias table can be created using near-field, not aerial, images. A second proximity correction, e.g. model-based OPC, can also be applied to the PSM layout. After first and second proximity corrections, the PSM can be manufactured.

DETAILED DESCRIPTION OF THE DRAWINGS

In accordance with one feature of the invention, the near-field image can be used to determine the appropriate bias to correct for the image intensity imbalance in a shifter pair. Using the near-field image rather than the aerial image significantly reduces the number of parameters to consider, thereby simplifying the computation of the bias. Thus, using the near-field image to determine the appropriate bias can be significantly faster than using the aerial image. Advantageously, the bias generated using the near-field image is substantially the same as the bias generated using the aerial image. Thus, the bias generated using the near-field image is also accurate, thereby ensuring optimal printing of the feature (i.e. the feature associated with the shifter pair) on the wafer.

Figure 1A:
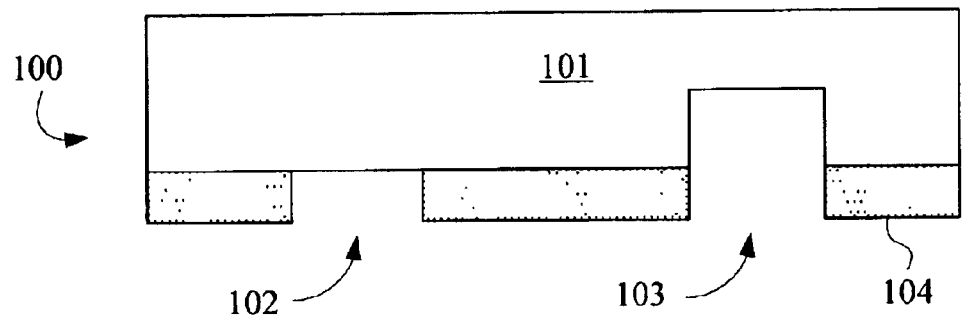
FIG. 1A illustrates a cross section of a simplified phase shifting mask (PSM) including a 0-degree phase shifter and a 180-degree phase shifter.
Figure 1B:
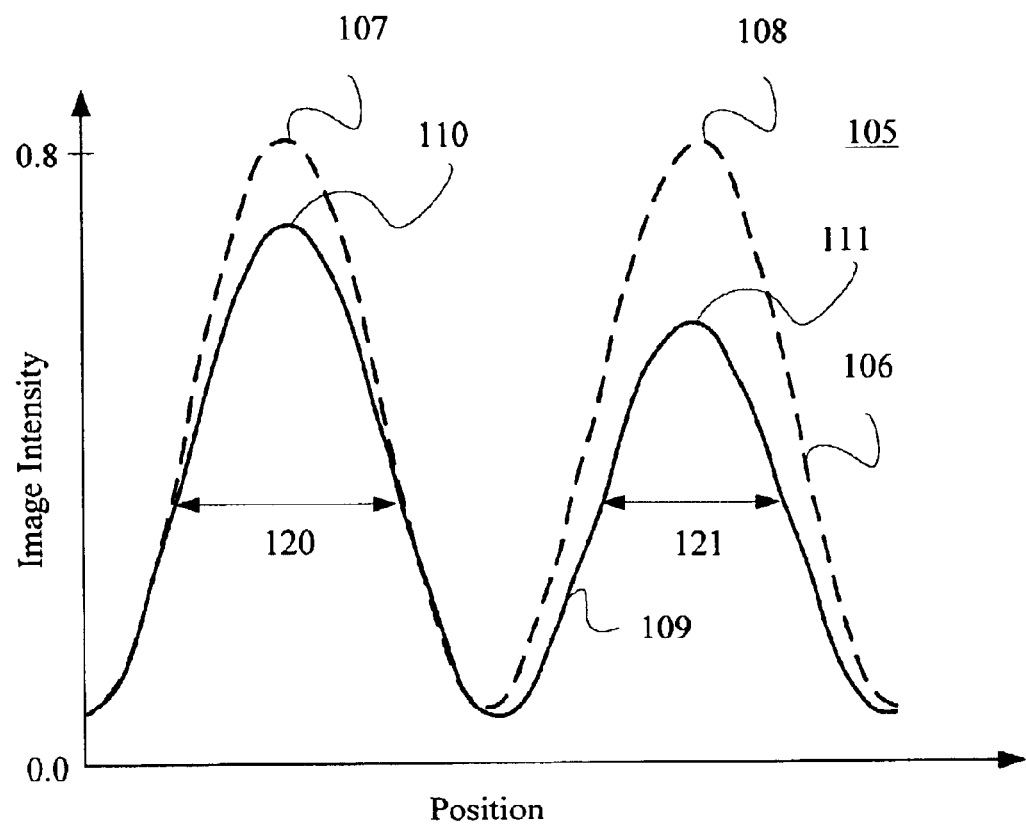
FIG. 1B illustrates two simulated aerial image waveforms assuming exposure of the PSM in FIG. 1A, wherein a first simulated waveform is generated using an approximated thin mask model and a second simulated waveform is generated using a rigorous EMF model. The second simulated waveform identifies an image intensity imbalance.
Figure 2A:
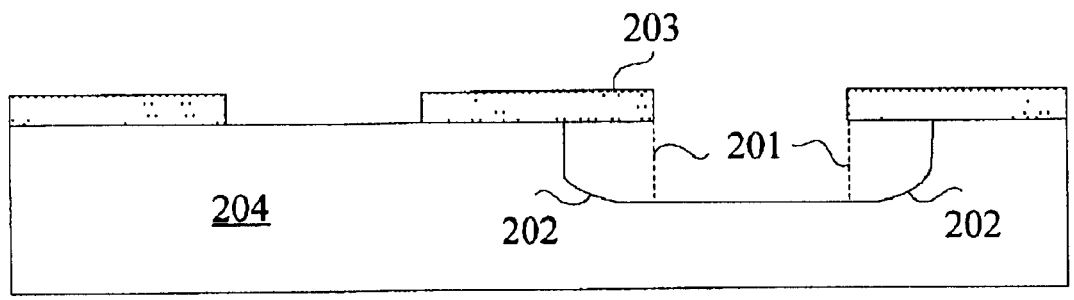
FIG. 2A illustrates undercutting of the 180-degree shifter, which can correct image intensity imbalance in some PSMs.
Figure 2B:
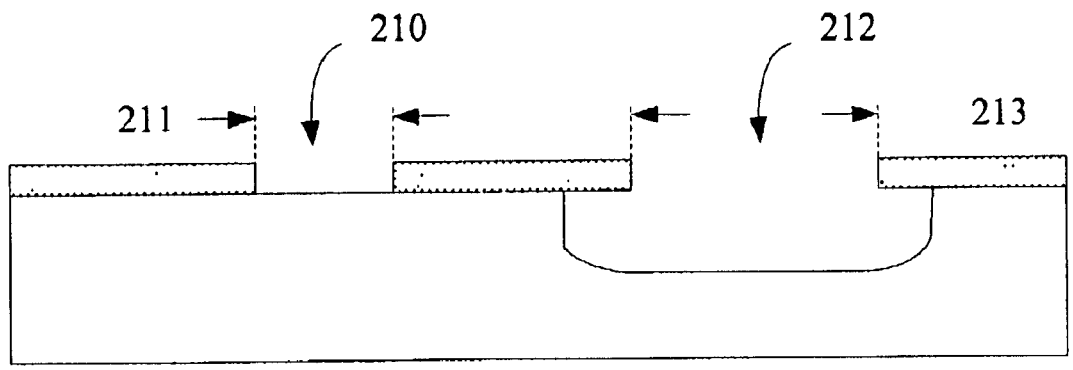
FIG. 2B illustrates space biasing of the 0-degree and 180-degree shifters, which can be used with undercutting to correct image intensity imbalance.

Of importance, image intensity imbalance is recognized as an artifact of the mask topography. In other words, the formation of the 180-degree shifter in the PSM creates the imbalance (see FIGS. 1A and 1B). A stepper effectively propagates this imbalance, which is typically modified therein due to parameters and properties of the stepper, e.g. numerical aperture and aberrations. Therefore, the magnitude of the imbalance in the near-field image generally differs from the magnitude of the imbalance in the aerial image. However, as described below, a metric computed from the near-field image can facilitate determining the image intensity imbalance solution, i.e. an appropriate bias to correct the imbalance.

Figure 5A:
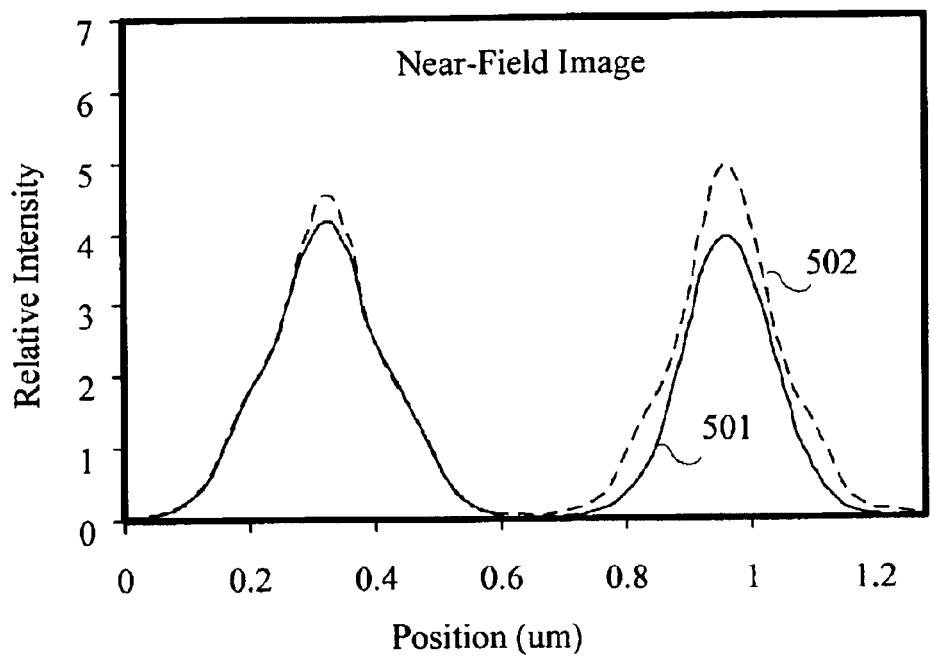
FIG. 5A illustrates simulated near-field images for 70 nm PSM lines (160 nm pitch) as a function of undercut.
Figure 5B:
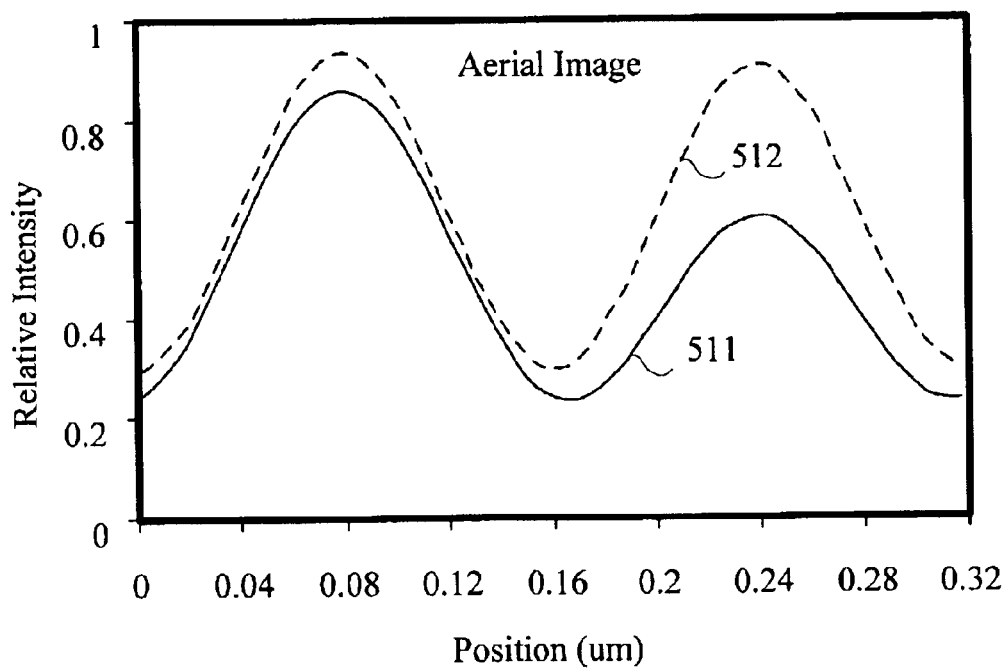
FIG. 5B illustrates simulated aerial images for 70 nm PSM lines (160 nm pitch) as a function of undercut.

To understand the advantages of using this metric, characteristics of near-field images and aerial images can be compared. For example, FIG. 5A illustrates two near-field image waveforms: a first waveform (solid line) 501 that represents a simulated near-field image with 0 nm undercut and a second waveform (dashed line) 502 that represents a simulated near-field image with 100 nm undercut. In contrast, FIG. 5B includes two aerial image waveforms that correspond to the near-field image waveforms of FIG. 5A: a first waveform (solid line) 511 that represents the simulated aerial image with 0 nm undercut and a second waveform (dashed line) 512 that represents the simulated aerial image with 100 nm undercut. Note that all waveforms in FIGS. 5A and 5B include two peaks, wherein the first occurring peak represents the relative intensity of a 0-degree shifter and the second occurring peak represents the relative intensity of a 180-degree shifter.

Of interest, both near-field image waveform 501 and aerial image waveform 511 indicate an image intensity imbalance, i.e. the second occurring peaks have less relative intensity than the first occurring peaks. Aerial image waveform 512 indicates that an undercut of 100 nm can correct the image intensity imbalance, i.e. the second occurring peak has substantially the same relative intensity as the first occurring peak. In contrast, near-field image waveform 502 appears to indicate that the second occurring peak has more relative intensity than the first occurring peak. However, assuming the 0-degree and 180-degree shifters have the same size, the 180-degree shifter cannot provide better transmission than the 0-degree shifter. Thus, although near-field image waveform 502 indicates that an undercut can change the imbalance, it is unclear that the image intensity imbalance is corrected.

Figure 6A:
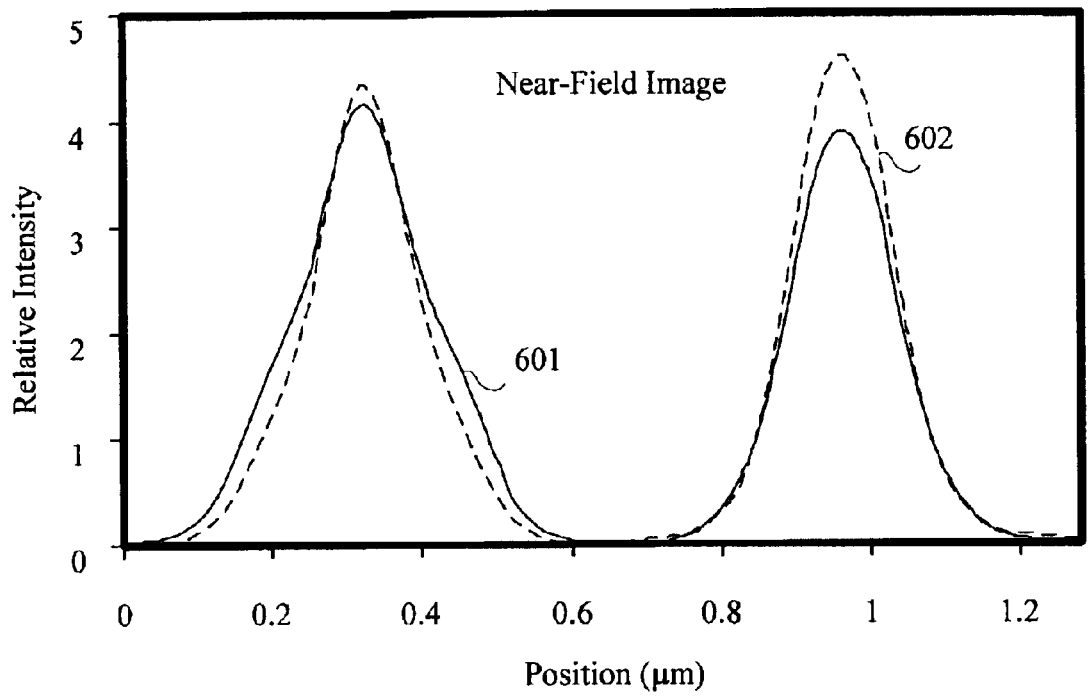
FIG. 6A illustrates simulated near-field images for 70 nm PSM lines (160 nm pitch) as a function of space bias (nm).
Figure 6B:
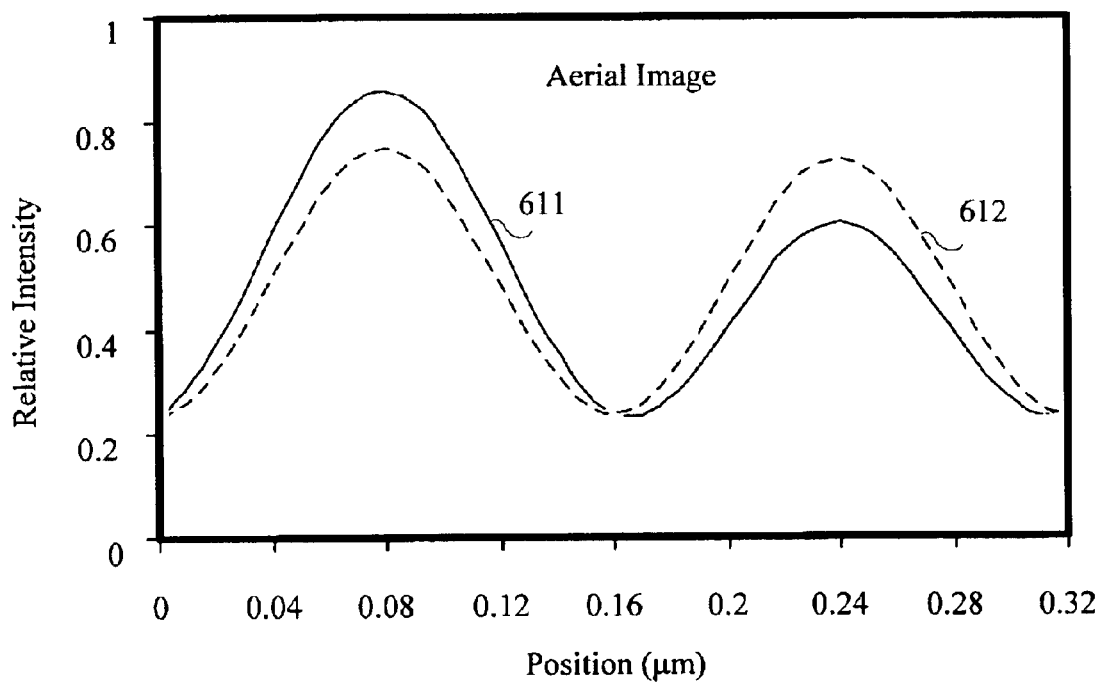
FIG. 6B illustrates simulated aerial images for 70 nm PSM lines (160 nm pitch) as a function of space bias (nm).

In a similar manner, FIG. 6A illustrates two near-field image waveforms: a first waveform (solid line) 601 that represents a simulated near-field image with 0 nm space bias and a second waveform (dashed line) 602 that represents a simulated near-field image with 40 nm space bias. In contrast, FIG. 6B includes two aerial image waveforms that correspond to the near-field image waveforms of FIG. 6A: a first waveform (solid line) 611 that represents a simulated aerial image with 0 nm space bias and a second waveform (dashed line) 612 that represents a simulated aerial image with 40 nm space bias. Note that all waveforms in FIGS. 6A and 6B include two peaks, wherein the first occurring peak represents the intensity of a 0-degree shifter and the second occurring peak represents the intensity of a 180-degree shifter.

Once again, both near-field image waveform 601 and aerial image waveform 611 indicate an image intensity imbalance, i.e. the second occurring peaks have less relative intensity than the first occurring peaks. Aerial image waveform 612 indicates that a space bias of 40 nm can correct the image intensity imbalance, i.e. the second occurring peak has substantially the same relative intensity as the first occurring peak. Near-field image waveform 602 appears to indicate that the second occurring peak has more relative intensity than the first occurring peak. As indicated previously, assuming the 0-degree and 180-degree shifters have the same size, the 180-degree shifter cannot provide better transmission than the 0-degree shifter. Thus, although near-field image waveform 602 indicates a change in the imbalance, it is unclear that the image intensity imbalance is corrected.

Figure 7A:
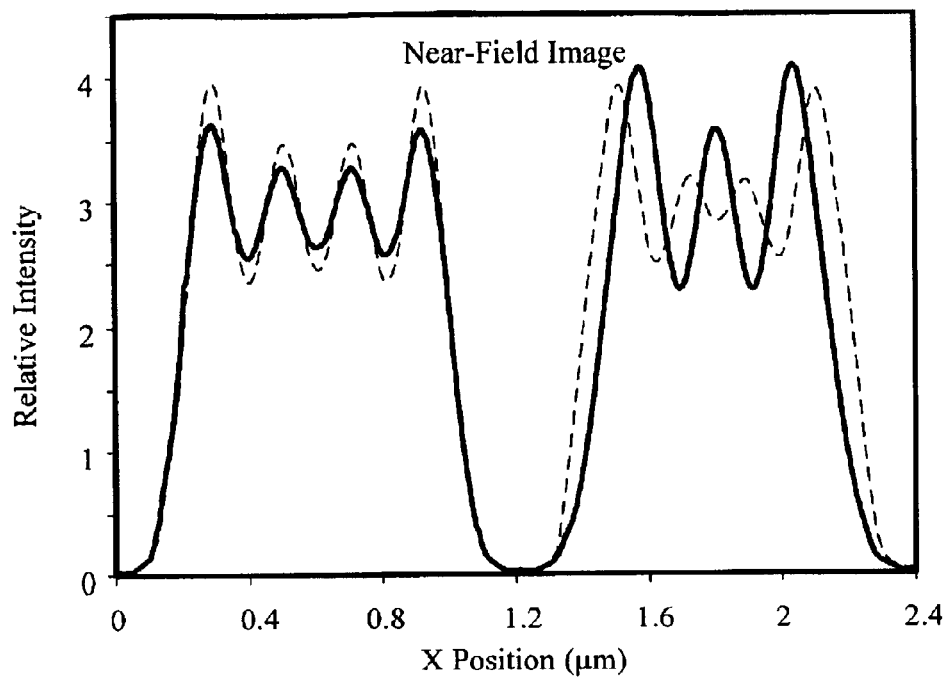
FIG. 7A illustrates simulated near-field images for 70 nm PSM lines (300 nm pitch) as a function of undercut.
Figure 7B:
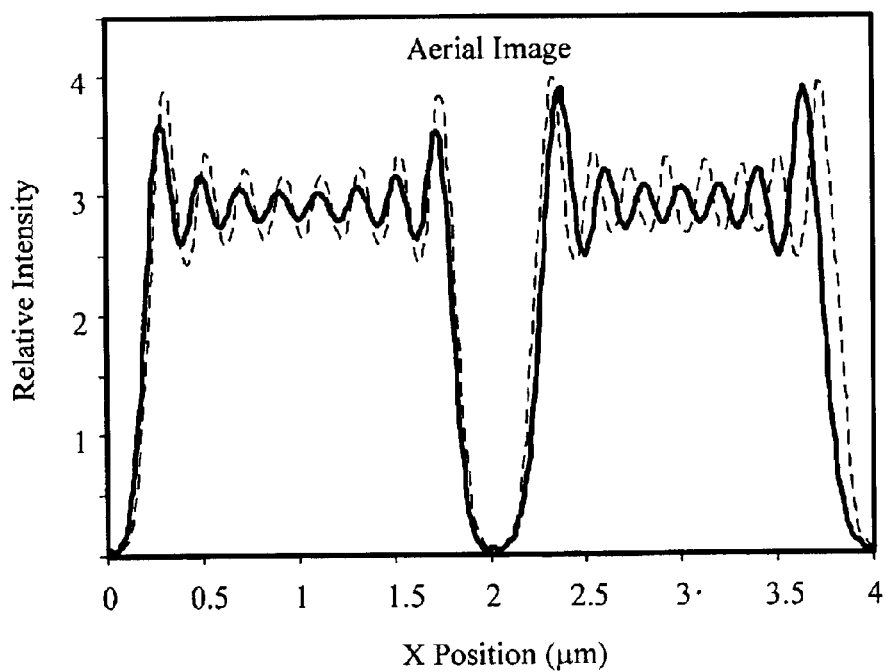
FIG. 7B illustrates simulated near-field images for 70 nm PSM lines (500 nm pitch) as a function of undercut.

Moreover, the noted image intensity imbalance in the near-field image can be more apparent in densely spaced features than for moderately spaced or isolated features. For example, FIGS. 7A and 7B illustrate near-field images for 70 nm printable lines as a function of undercut (wherein the solid lines in the graphs represent 0 nm undercut and the dashed lines in the graphs represent 100 nm undercut). However, the near-field images in FIGS. 7A and 7B represent a pitch of 300 nm (i.e. moderately spaced features) and 500 nm (isolated features), respectively. Compared to the near-field image (i.e. 160 nm pitch) in FIG. 5A, the image intensity imbalance becomes difficult to identify in FIGS. 7A and 7B in light of multiple peaks within areas-representing the transmission of the 0-degree and 180-degree shifters.

Figure 8:
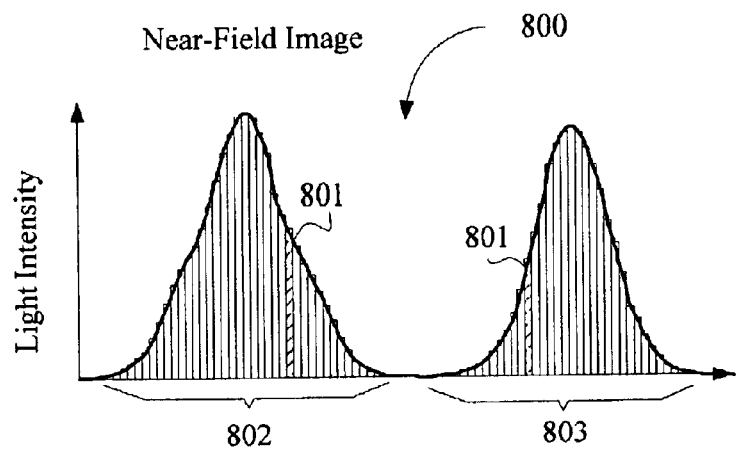
FIG. 8 illustrates a simplified integration of a waveform representing a near-field image, wherein this integration can provide the image intensity ratio (IIR).

Therefore, in accordance with one feature of the invention, a metric called the integrated intensity ratio (IIR) can be used to quantitatively evaluate the transmission non-uniformity at the near-field image. Specifically, instead of measuring the peaks or CDs in the near-field image, the intensity of the 0-degree and 180-degree areas in the near-field image can be integrated. FIG. 8 illustrates a simplified integration of an exemplary near-field image waveform 800. To perform this integration, the area under waveform 800 is divided into small sub-regions, each sub-region preferably having an equal width. Simple geometrical forms 801 that are easy to compute can approximate these sub-regions. These simple geometrical forms can include, for example, rectangles (as shown in FIG. 8, two geometrical forms 801 shown with a fill pattern), triangles, and trapezoids. Note that the width of geometrical forms 801, which corresponds to the intervals of the sub-regions, is illustrative only and can be significantly smaller to more accurately perform an integration of waveform 800. Additionally, upper, midpoint, and lower Riemann sums of the types generally used for numerical integration approximations can be employed as well.

In waveform 800, an area 802 represents a transmission of a 0-degree shifter whereas an area 803 represents a transmission of a 180-degree shifter. A sum of geometrical forms 801 can then be performed for both areas 802 and 803. In accordance with one feature of the invention, the IIR can be defined as the near-field integrated image intensity difference between 0 and 180-degree shifters, normalized by the near-field integrated image intensity of the 0-degree shifter, in percent (see equation immediately hereafter).

$$IIR = \frac{Integral_{(0-degree\ shifter)} - Integral_{(180-degree\ shifter)}}{Integral_{(0-degree\ shifter)}} \times 100\%$$

The IIR of the near-field image can be used to correct for image intensity imbalance. As a check on the accuracy of the IIR as a method for determining this correction, the IIR can be compared to the space CD ratio, which is known to accurately characterize image intensity imbalance in the aerial image. The space CD ratio can be defined as the aerial image CD difference between 0 and 180-degree shifters, normalized by the aerial image CD of the 0-degree shifter, in percent (see equation immediately hereafter).

$$\text{Space } CD \text{ Ratio} = \frac{CD_{(0-degree\ shifter)} - CD_{(180-degree\ shifter)}}{CD_{(0-degree\ shifter)}} \times 100\%$$

Figure 9A:
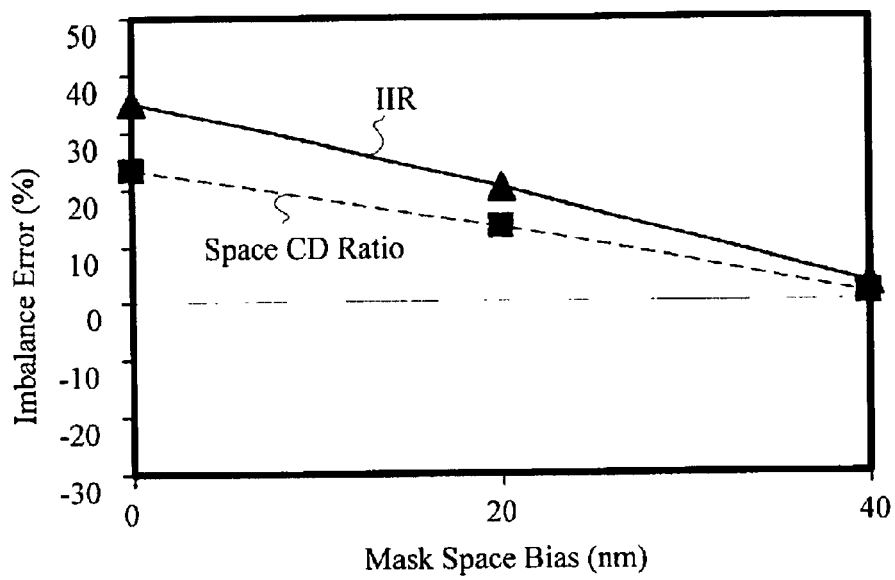
FIG. 9A illustrates a graph of imbalance error calculated using the IIR and the aerial image space CD ratio for 70 nm PSM lines (160 nm pitch) as a function of the mask space bias.

FIG. 9A illustrates exemplary performance comparisons of the IIR (solid line) and the space CD ratio (dashed line) as functions of the mask space bias. Of importance, the IIR and the space CD ratio similarly predict a reduction of the image imbalance error with the increase of the space bias on the mask. Advantageously, the IIR provides substantially the same mask space bias as the space CD ratio for 0 imbalance error (i.e. when the imbalance is corrected). In other words, both metrics converge to zero at approximately the same point. Therefore, IIR can accurately predict the solution for an image intensity imbalance error using the near-field image.

Figure 9B:
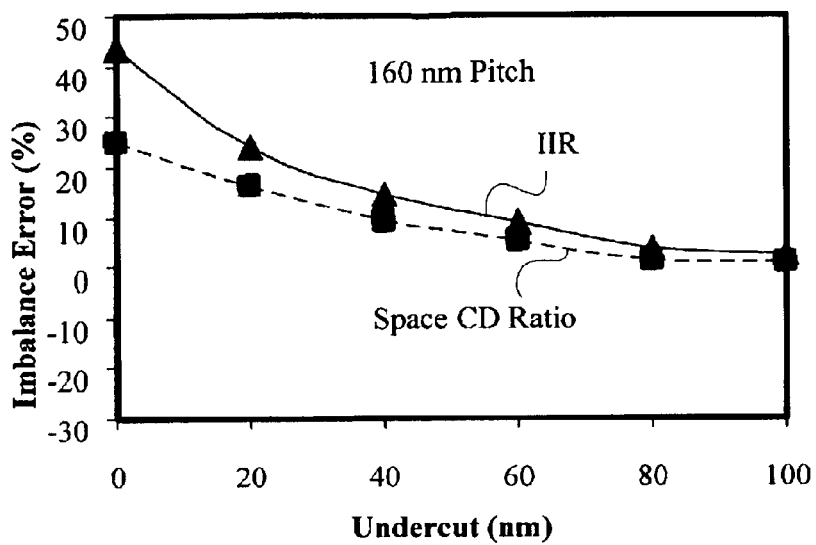
FIG. 9B illustrates a graph of imbalance error calculated using IIR and the aerial image space CD ratio for 70 nm PSM lines (160 nm pitch) as a function of undercut.
Figure 9C:
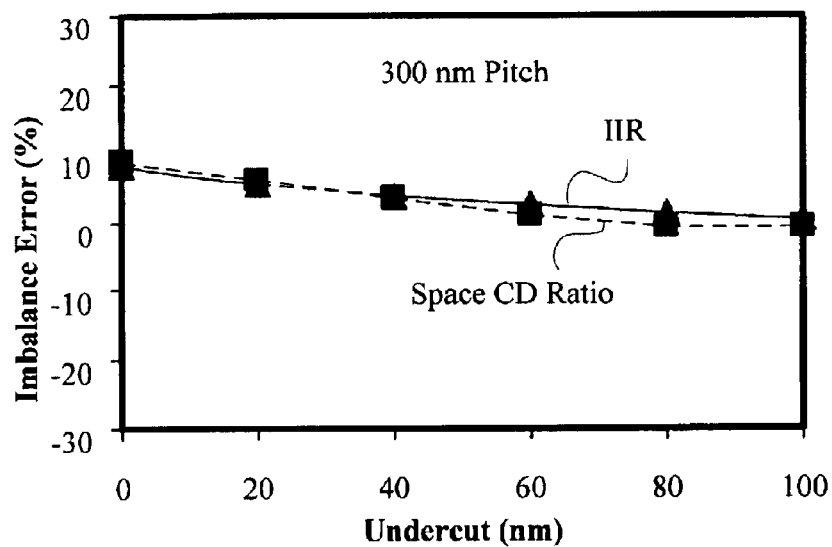
FIG. 9C illustrates a graph of imbalance error calculated using IIR and the aerial image space CD ratio for 70 nm PSM lines (300 nm pitch) as a function of undercut.
Figure 9D:
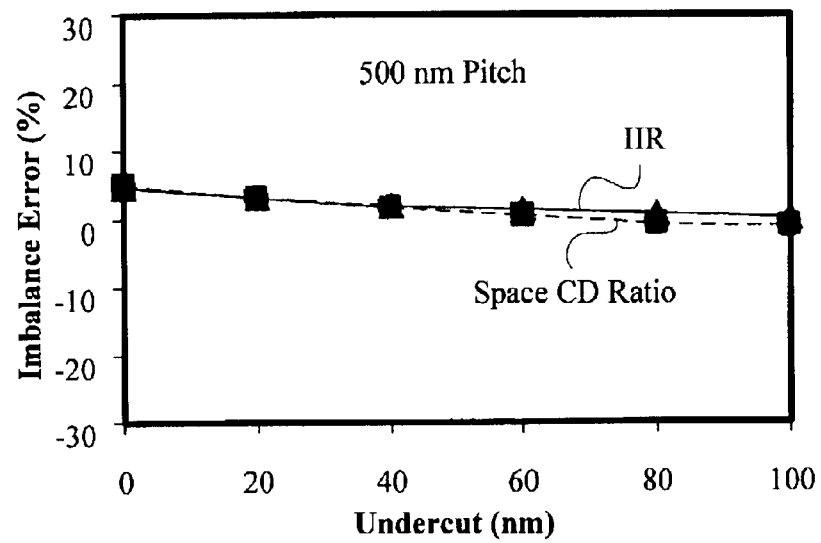
FIG. 9D illustrates a graph of imbalance error calculated using IIR and the aerial image space CD ratio for 70 nm PSM lines (500 nm pitch) as a function of undercut.

FIGS. 9B–9D show the impact of varying undercut on the near-field image for a 70 nm line at three different pitch sizes from dense to isolated (160 nm, 300 nm, and 500 nm pitches, respectively). As illustrated in FIGS. 9B–9D, the IIR metric correlates closely with the aerial image space CD ratio as image imbalance is evaluated versus varying undercut and pattern pitch. Of interest, the correlation is particularly close for moderately spaced and isolated features (FIGS. 9C and 9D). Thus, in contrast to the waveforms of FIGS. 7A and 7B, the IIR can clearly identify an image intensity imbalance. Additionally, a simulation tool can use the IIR as a data point in its program to quickly converge to the appropriate correction for that image intensity imbalance.

Figure 3:
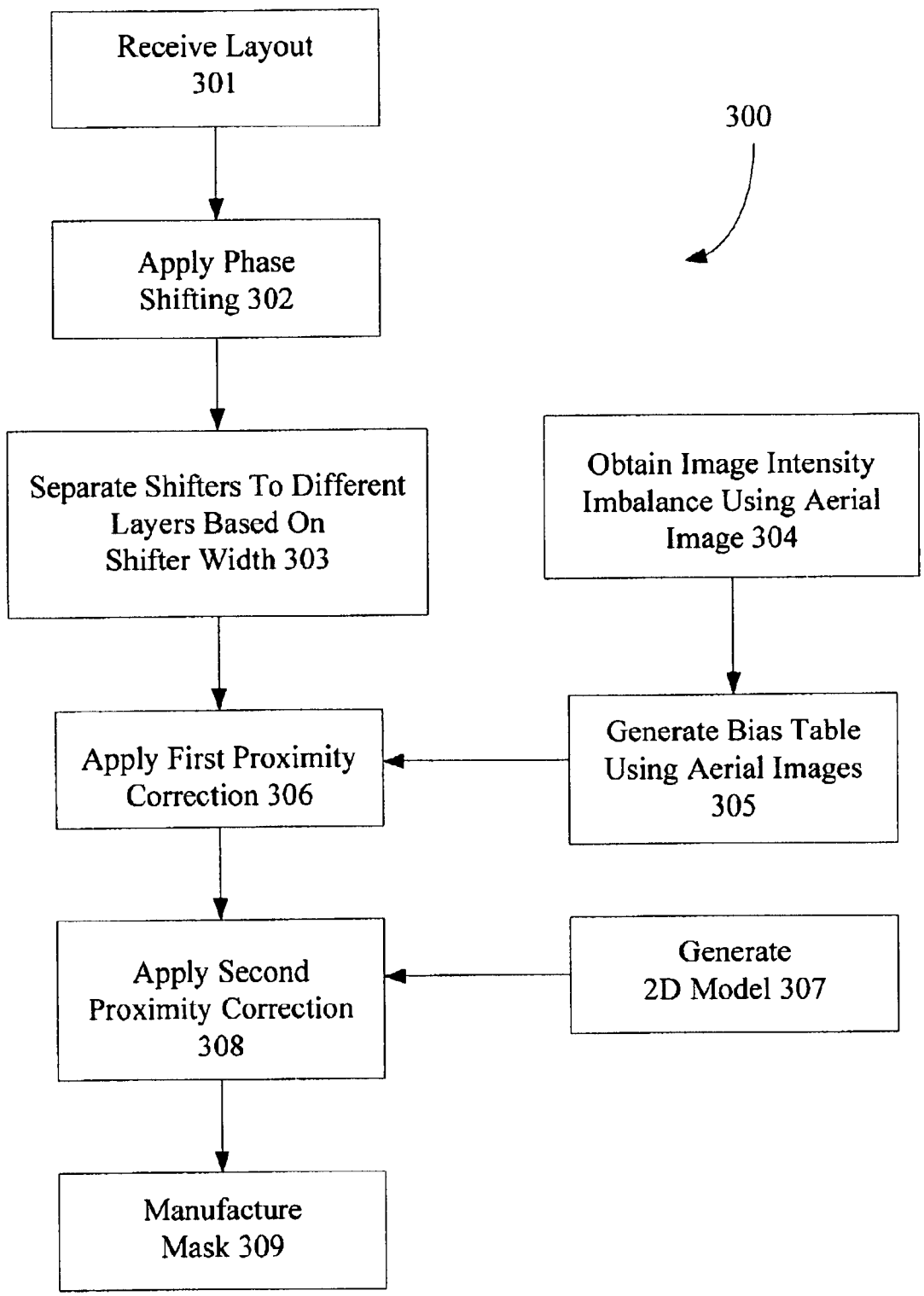
FIG. 3 illustrates a PSM transmission error correction flow using aerial images.
Figure 4:
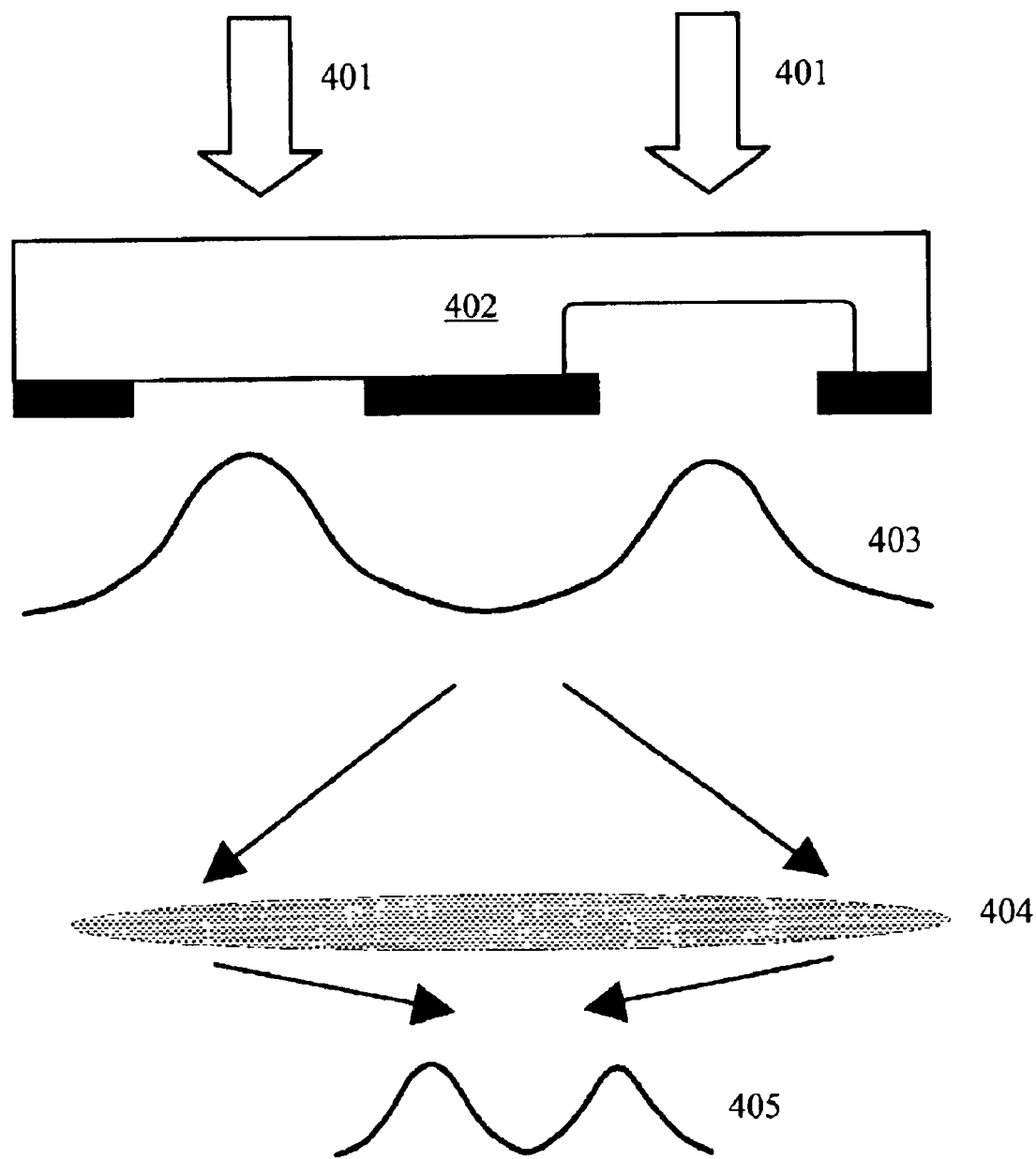
FIG. 4 illustrates a simplified optical path of a stepper. Exemplary near-field and aerial images are shown in the optical path.
Figure 10:
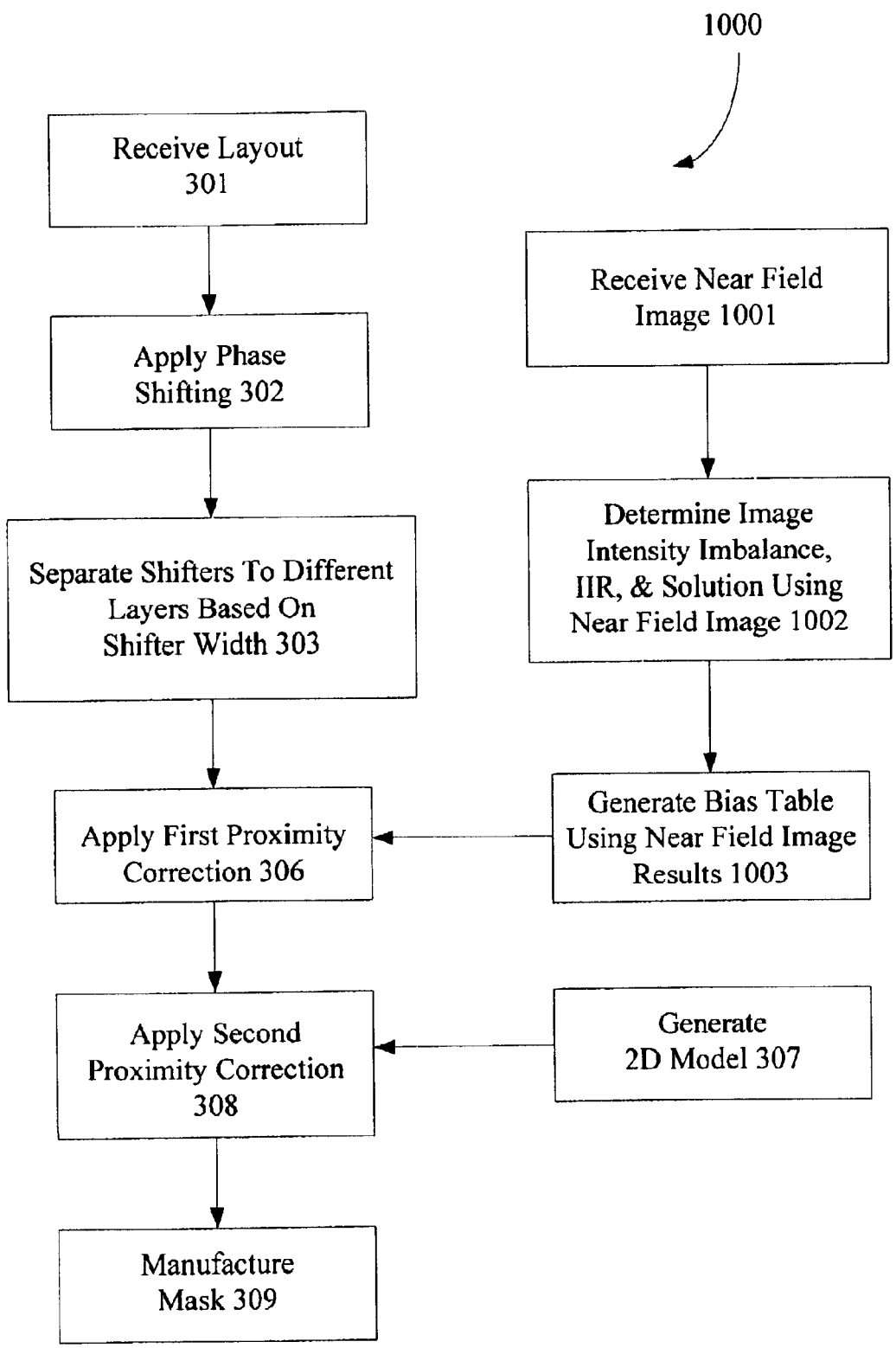
FIG. 10 illustrates a flow chart in which shifter biasing, as determined by near-field analysis, can be incorporated into mask manufacture.

FIG. 10 illustrates a flow chart 1000 in which shifter biasing, as determined by near-field analysis, can be incorporated into a tape out process (and/or mask manufacture). Flow chart 1000 is similar to flow chart 300 of FIG. 3 except that the bias table is created using the near-field image instead of the aerial image. Specifically, after receiving a near-field image (i.e. a plot of image intensity versus position) in step 1001, the image intensity imbalance can be identified in step 1002 by integrating the areas corresponding to the 0-degree and 180-degree shifters (see FIG. 8). At this point, the IIR can be computed for that shifter pair. Using this TIR, the appropriate space bias for correcting an image intensity imbalance of that shifter pair can be determined. Specifically, different biases can be applied and analyzed for that shifter pair, thereby providing different IIRs. In one embodiment, computing IIRs using different biases can continue until the IIR equals 0. In another embodiment, computing IIRs using different biases can continue until a predetermined time (e.g. on the order of seconds) has lapsed and/or a maximum bias is reached. Note that various optimization approaches could be used to converge the error to zero. Steps 1001 and 1002 can be advantageously performed using simulation, thereby eliminating the need for a physical mask as used in AIMS. In one embodiment, the iN-Tandem™ tool, licensed by Numerical Technologies, Inc., can be used to perform the desired simulations and proximity corrections.

In an alternative embodiment, the intensity imbalance correction can be done entirely using model-based proximity correction. In this case, steps 303, 306, and 1003 could be replaced with a shifter imbalance correction using the near-field solutions of step 1002 and an iterative approach of the type generally used in model-based OPC. In one embodiment, the intensity imbalance correction could be performed at the same time as the second proximity correction (e.g. model-based OPC).

Note that the simulation can include mask structure and layout properties, such as shifter dimensions, undercut, line width of chrome patterns, and pitch. However, because a near-field image is used instead of an aerial image, the simulation can advantageously eliminate the optical and exposure settings of the imaging system, such as the lens NA and aberrations, partial coherence, and exposure dose. In other words, the aerial image approach requires rigorous calculations including the near-field. However, the near-field approach eliminates the aerial image calculation. Thus, because the number of variables is dramatically reduced, the simulation associated with the near-field image can be significantly faster than a simulation of the aerial image. Moreover, of importance, analyzing the near-field image can yield substantially the same solution, i.e. biasing, as the aerial image to correct for the image intensity imbalance.

The biasing results can be captured in a table that correlates each original shifter pair size with an appropriate bias to correct for image intensity imbalance in step 1003. This biasing information can then be used when rule-based OPC is performed on the layout in step 306.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, because the lens is a filter on higher order diffraction, a Fourier (or other) transform approximating the lens could be applied to the near-field values. Moreover, although calculation of the IIR is discussed herein, other calculations associated with the near-field image could be used. Additionally, the methods described herein can be applied to any lithographic process technology, including ultraviolet, deep ultraviolet (DUV), extreme ultraviolet (EUV), x-ray, electron projection lithography (EPL), and ebeam. Accordingly, it is intended that the scope of the invention be defined by the following claims and their equivalents.

What is claimed is:

1. A method of correcting an image intensity imbalance for a phase shifting mask (PSM), the method comprising:
   computing a near-field image for a pair of phase shifters; and
   determining a bias for each phase shifter in the pair of phase shifters based on the near-field image, wherein the bias corrects the image intensity imbalance.

2. The method of claim 1, wherein receiving the near-field image includes simulating the near-field image using a layout of the PSM.

3. The method of claim 1, wherein determining the bias includes:
   integrating a first area under a waveform, the waveform representing the near-field image associated with the PSM, and the first area corresponding to a transmission of a first phase shifter in the pair of phase shifters;
   integrating a second area under the waveform, the second area corresponding to a transmission of a second phase shifter in the pair of phase shifters, wherein exposure radiation transmitted by the first phase shifter is approximately 180 degrees out of phase with exposure radiation transmitted by the second phase shifter; and
   determining a difference between the second area and the first area.

4. The method of claim 3, wherein determining the bias further includes dividing the difference by the first area, thereby generating a normalized result.

5. The method of claim 4, wherein determining the bias further includes using the normalized result to determine the bias that substantially corrects the image intensity imbalance.

6. The method of claim 1, wherein determining the bias includes simulating mask structure and layout properties.

7. The method of claim 6, wherein the mask structure includes at least one of phase shifter dimensions and undercut.

8. The method of claim 6, wherein the layout properties include at least one of line width of chrome patterns and pitch.

9. The method of claim 6, wherein determining the bias does not include simulating optical and exposure settings of an imaging system usable with the PSM.

10. A phase shifting mask (PSM) layout file comprising:
a plurality of shifter sizes, wherein exposure radiation transmitted by a first shifter in a pair of shifters is approximately 180 degrees out of phase with exposure radiation transmitted by a second shifter in the pair; and
a bias for each shifter size, the bias correcting an image intensity imbalance in the pair of shifters, wherein the bias is computed using a near-field image.

11. The PSM layout file of claim 10, further including specific mask structure and layout properties, but not settings of an imaging system, for each pair of shifters.

12. The PSM layout file of claim 11, wherein the specific mask structure and layout properties include at least one of shifter dimensions, undercut, line width of chrome patterns, and pitch.

13. A method of generating a phase shifting mask (PSM) having minimal image intensity imbalance, the method comprising:
receiving a layout;
applying phase shifting to the layout, thereby generating a PSM layout;
applying a first proximity correction to the PSM layout based on near-field images of pairs of shifters;
applying a second proximity correction to the PSM layout; and
manufacturing the PSM after application of the first and second proximity corrections.

14. The method of claim 13, further including:
receiving a near-field image from a pair of shifters for the PSM layout;
determining a bias for the pair of shifters based on the near-field image, wherein the bias corrects an image intensity imbalance; and
including the bias in the bias table.

15. The method of claim 14, wherein receiving the near-field image includes simulating the near-field image using the PSM layout.

16. The method of claim 14, wherein determining the bias includes:
integrating a first area under a waveform, the waveform representing the near-field image, and the first area corresponding to a transmission of a first shifter in the pair of shifters;
integrating a second area under the waveform, the second area corresponding to a transmission of a second shifter in the pair of shifters; and
determining a difference between the second area and the first area.

17. The method of claim 16, wherein determining the bias further includes dividing the difference by the first area, thereby generating a normalized result.

18. The method of claim 17, wherein determining the bias further includes simulating with the normalized result to determine the bias.

19. The method of claim 18, wherein simulating with the normalized result includes determining at least one of phase shifter dimensions, undercut, line width of chrome patterns, and pitch associated with the PSM layout.

20. The method of claim 19, wherein simulating with the normalized result does not include determining optical and exposure settings of an imaging system.

* * * * *